(12) United States Patent
Lin et al.

(10) Patent No.: US 11,602,057 B2
(45) Date of Patent: Mar. 7, 2023

(54) DISPLAY DEVICE AND COLOR CORRECTING METHOD THEREOF

(71) Applicant: Qisda Corporation, Taoyuan (TW)

(72) Inventors: Wu-Shen Lin, Taoyuan (TW);
Hung-Hsun Liu, Taoyuan (TW);
Wen-Ching Hsieh, New Taipei (TW);
Chin-Yi Yu, New Taipei (TW)

(73) Assignee: Qisda Corporation, Taoyuan (TW)

( * ) Notice: Subject to any disclaimer, the term of this patent is extended or adjusted under 35 U.S.C. 154(b) by 561 days.

(21) Appl. No.: 16/732,300

(22) Filed: Dec. 31, 2019

(65) Prior Publication Data
US 2020/0240582 A1 Jul. 30, 2020

(30) Foreign Application Priority Data
Jan. 30, 2019 (CN) .......................... 201910089727.4

(51) Int. Cl.
*H05K 5/00* (2006.01)
*H02K 11/21* (2016.01)
*H02K 7/00* (2006.01)
*H05K 5/02* (2006.01)

(52) U.S. Cl.
CPC ........... *H05K 5/0017* (2013.01); *H02K 7/003* (2013.01); *H02K 11/21* (2016.01); *H05K 5/0004* (2013.01); *H05K 5/0217* (2013.01)

(58) Field of Classification Search
CPC .............................. H02K 11/00; H02K 7/003
USPC ................................ 310/68 B, 71, 75 R, 98
See application file for complete search history.

(56) References Cited

FOREIGN PATENT DOCUMENTS

| CN | 106384563 A | | 2/2017 |
|----|----|----|----|
| CN | 106463074 A | | 2/2017 |
| JP | 2012150136 A | * | 8/2012 |

OTHER PUBLICATIONS

Office action of counterpart application by Taiwan IP Office dated Jan. 7, 2020.
Office action of counterpart application by SIPO dated Jul. 29, 2020.

\* cited by examiner

*Primary Examiner* — Jose A Gonzalez Quinones

(57) ABSTRACT

A display device including a display panel, a shaft, a correcting sensor and a driving module is provided. The display panel has a display surface. The shaft has an axial end and a correcting end opposite the axial end. The correcting sensor is disposed on the correcting end. When the shaft is rotated relative to the axial end, the correcting sensor is moved to a second position from a first position and faces the display surface at the second position. The driving module is configured to translate the shaft when the correcting sensor is at the second position, such that the correcting sensor can be moved to a detecting position from the second position, wherein the distance of the second position relative to the display surface is greater than the distance of the detecting position relative to the display surface.

17 Claims, 14 Drawing Sheets

130

130

DISPLAY DEVICE AND COLOR CORRECTING METHOD THEREOF

This application claims the benefit of People's Republic of China application Serial No. 201910089727.4, filed Jan. 30, 2019, the subject matter of which is incorporated herein by reference.

BACKGROUND OF THE INVENTION

Field of the Invention

The invention relates in general to a display device, and more particularly to a display device having color correction function and a color correcting method thereof.

Description of the Related Art

Very few of the display devices have color correction function. Normally, the user needs to purchase a plug-in color correction module to achieve color constancy and standardization of the display device.

However, for most consumers, an extra cost will incur for the purchase of a color correction module and inconvenience will occur during the installation of the color correction module. If the color correction module is installed at an incorrect correcting position, the sensor of the color correction module will be interfered by ambient light and will detect unnecessary data, and color correction of the display device will therefore be affected.

SUMMARY OF THE INVENTION

The invention is directed to a display device having color correction function. The correcting sensor can be installed together with the display panel, and can further be moved to a second position from a first position by a shaft. Furthermore, the correcting sensor can be moved to a detecting position from the second position by a driving module, such that the correcting sensor can get closer to the display panel to obtain correction values with higher accuracy.

According to an embodiment of the present invention, a display device including a display panel, a shaft, a correcting sensor and a driving module is provided. The display panel has a display surface. The shaft has an axial end and a correcting end opposite the axial end. The correcting sensor is disposed on the correcting end. When the shaft is rotated relative to the axial end, the correcting sensor is moved to a second position from a first position and faces the display surface at the second position. The driving module is configured to translate the shaft when the correcting sensor is at the second position, such that the correcting sensor can be moved to a detecting position from the second position, wherein the distance of the second position relative to the display surface is greater than the distance of the detecting position relative to the display surface.

According to another embodiment of the present invention, a color correcting method for a display is provided. The display has a panel and a shaft, wherein a correcting sensor is disposed at a first end of the shaft, and a second end of the shaft is connected to a rotation axis on an edge of the panel. The color correcting method includes: driving the shaft to rotate relative to the rotation axis, such that the correcting sensor can be rotated to a second position from a first position, wherein the second position is located above the panel; driving the shaft to translate towards the panel, such that the correcting sensor can be translated to a detecting position from the second position.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention. Similar/identical designations are used to indicate similar/identical elements. Directional terms such as above, under, left, right, front or back are used in the following embodiments to indicate the directions of the accompanying drawings, not for limiting the present invention.

According to an embodiment of the present invention, a display device is provided. A correcting sensor can be received in an outer casing of the display device or exposed outside the display device. When the correcting sensor is not needed, the correcting sensor can be received in the outer casing of the display device to achieve an aesthetic appearance. When the image frame of the display device has color decay, the user can perform color correction with the correcting sensor, such that the display device can truthfully display colors.

When the color correction is needed, the correcting sensor is translated to the front of the display surface, such that the correcting sensor can get closer to the display surface to avoid being interfered by the ambient light.

Figure 1:
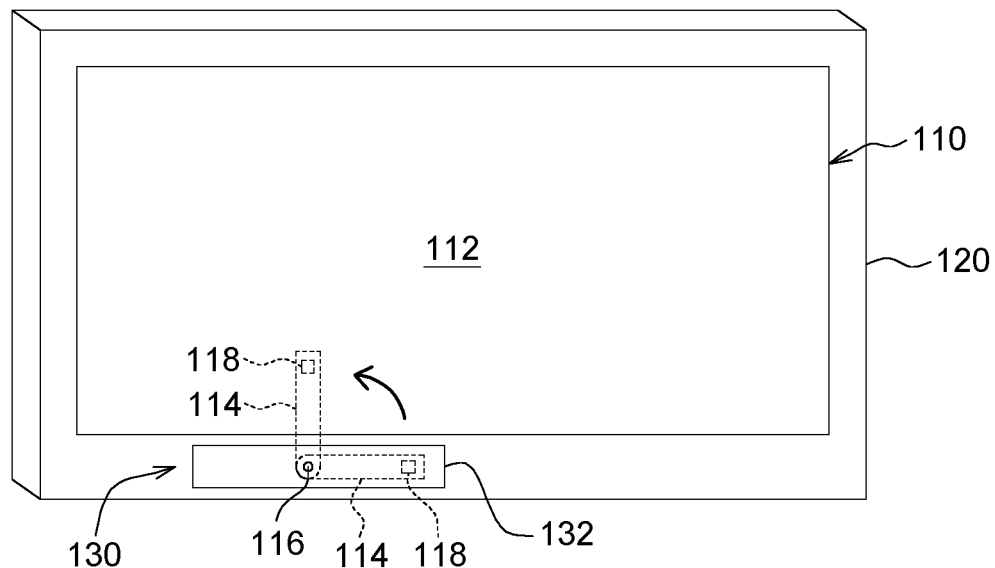
FIG. 1 is a schematic diagram of a display device according to an embodiment of the present invention, wherein a color correction module can be assembled in an outer casing of the display device and located at a receiving position.
Figure 2A:
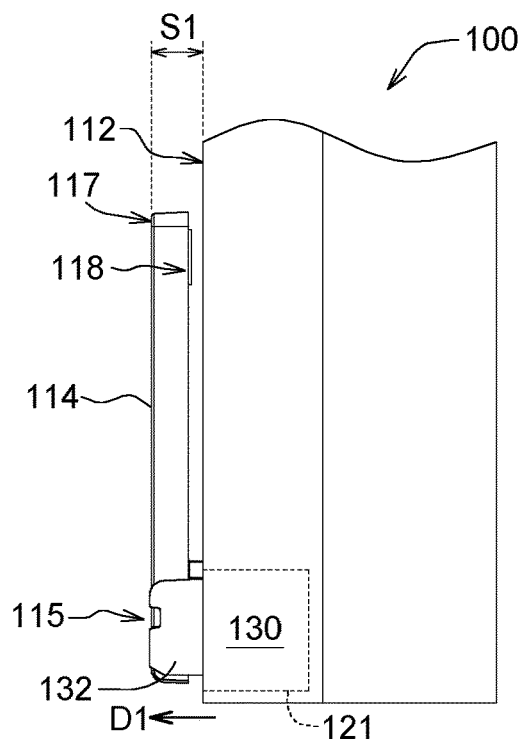
FIGS. 2A and 2B respectively are schematic diagrams of a display device according to an embodiment of the present invention, wherein a correcting sensor can be rotated to a second position from a first position and further moved to a detecting position from the second position along a second direction.
Figure 2B:
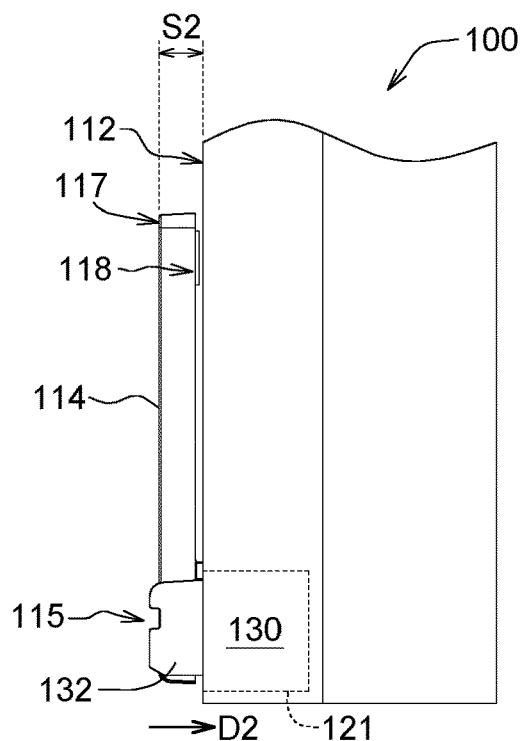

Refer to FIGS. 1, 2A and 2B. FIG. 1 is a schematic diagram of a display device 100 according to an embodiment of the present invention, wherein a color correction module 130 can be assembled in an outer casing 120 of the display device 100. FIG. 2A shows a correcting sensor 118 of the display device 100 of FIG. 1, wherein the correcting sensor 118 can be rotated to a second position in a vertical state from a first position in a horizontal state. FIG. 2B shows the correcting sensor 118 of the display device 100, wherein the correcting sensor 118 can be moved to a detecting position from the second position.

As indicated in FIG. 1, the display device 100 includes a display panel 110, a shaft 114, a correcting sensor 118, a carrier 132 and an outer casing 120. The display panel 110 has a display surface 112. The shaft 114 is disposed on the carrier 132. The correcting sensor 118 is disposed at a first end of the shaft 114, and a second end of the shaft 114 is connected to a rotation axis 116 on an edge of the display panel 110. As indicated in FIG. 2A, the first end of the shaft 114 is a correcting end 117, and the second end of the shaft 114 is an axial end 115.

In FIG. 1, the carrier 132 is received in the outer casing 120, and the correcting sensor 118 is located at a receiving position. In FIG. 2A, the carrier 132 is partly exposed outside the outer casing 120, and the correcting sensor 118 is located at a second position. In FIG. 2B, the correcting sensor 118 is located at a detecting position.

As indicated in FIGS. 1 and 2A, the outer casing 120 is configured to receive the display panel 110 and expose the display surface 112. The outer casing 120 has an opening 121 configured to receive the carrier 132 of the color correction module 130. As indicated in FIG. 2A, the carrier 132 can move back and forth along a normal direction (that is, the first direction D1) of the display surface 112. In FIG. 1, the carrier 132 has a front surface, which is coplanar with the outer surface of the outer casing 120 when the carrier 132 is received in the opening 121.

As indicated in FIG. 2A, when the carrier 132 is moved forward along the first direction D1, the shaft 114 is moved to the first position from the receiving position through the movement of the carrier 132. Then, the shaft 114 is rotated to the second position from the first position by the driving module. That is, when the shaft 114 is moved to the first position, the shaft 114 is driven to rotate relative to the rotation axis 116, such that the correcting sensor 118 can be rotated to a second position from a first position. The second position is located above the display surface 112, that is, the correcting sensor 118 faces the display surface at a second position 112.

As indicated in FIG. 2B, when the correcting sensor 118 is at the second position, the driving module is configured to translate the shaft 114, such that the correcting sensor 118 can be moved to a detecting position from the second position to perform color correction, wherein the distance of the second position relative to the display surface 112 is greater than the distance of the detecting position relative to the display surface 112. That is, the detecting position is closer to the display surface 112 than the second position. In an embodiment, the distance of the second position relative to the display surface 112 is 1 mm, and the distance of the detecting position relative to the display surface 112 is less than 0.5 mm or 0.1 mm, or is equivalent to 0 mm, that is, there is no gap between the detecting position and the display surface 112. In FIGS. 2A and 2B, the first movement distance S1 represents the distance for which the carrier 132 moves along the first direction D1; the second movement distance between S1 and S2 represents the distance for which the carrier 132 moves along the second direction D2. The distance S2 represents the distance between the outer surface of the shaft 114 and the display surface 112 when the correcting sensor 118 is located at the detecting position.

After color correction is completed, the driving module 138 translates the shaft 114, such that the correcting sensor 118 can be moved to the second position from the detecting position to be away from the display surface 112. Then, the shaft 114 is rotated to the first position from the second position by the driving module, and is received in the outer casing 120 of the display device 100 through the movement of the carrier 132.

In the above embodiments, the shaft 114 moves the correcting sensor 118 to the detecting position through the movement of the carrier 132 in a direction inverse to the normal direction of the display surface 112 (that is, the second direction D2), but the present invention is not limited thereto. The shaft 114 can be directly exposed outside the outer casing 120 of the display device 100, and can achieve the same effect through the rotation and translation of the driving module.

Figure 3A:
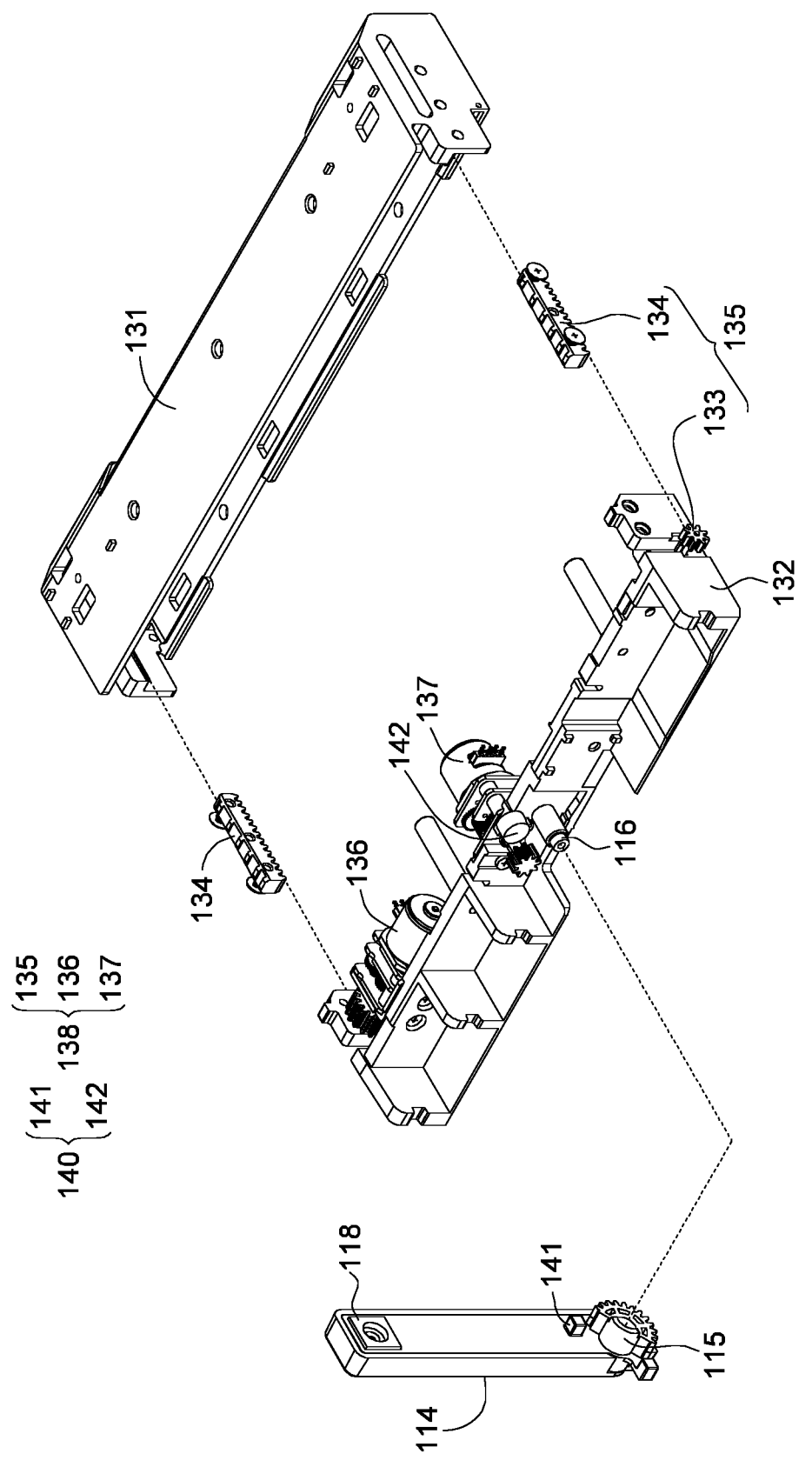
FIG. 3A is an explosion diagram of a color correction module according to an embodiment of the present invention.
Figure 3B:
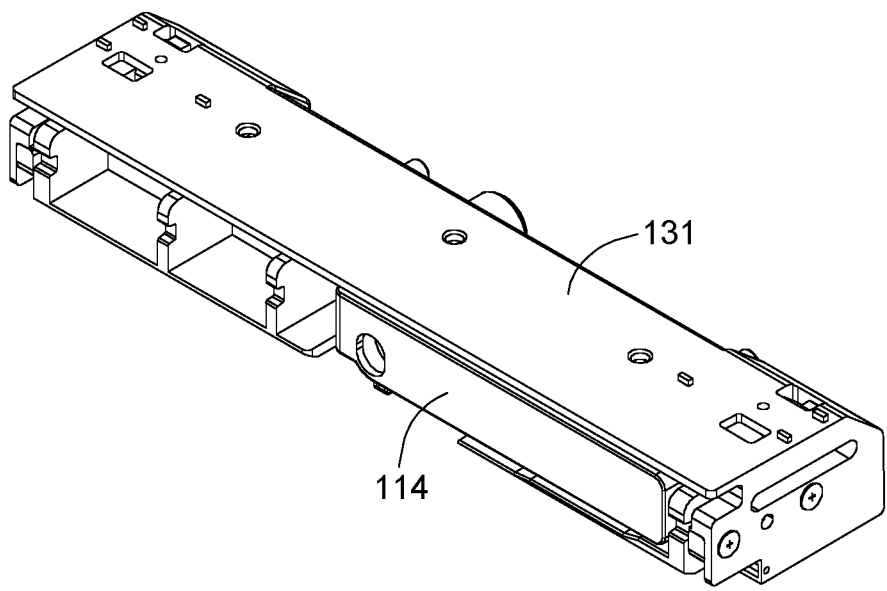
FIGS. 3B-3D respectively are operation diagrams of the driving module of FIG. 3A when driving a correcting sensor.
Figure 3C:
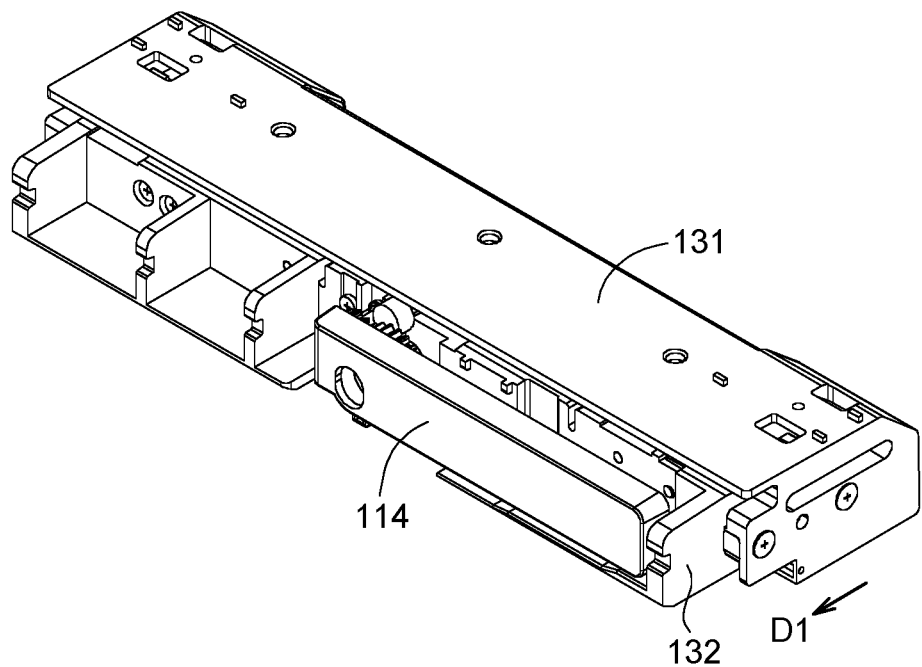
Figure 3D:
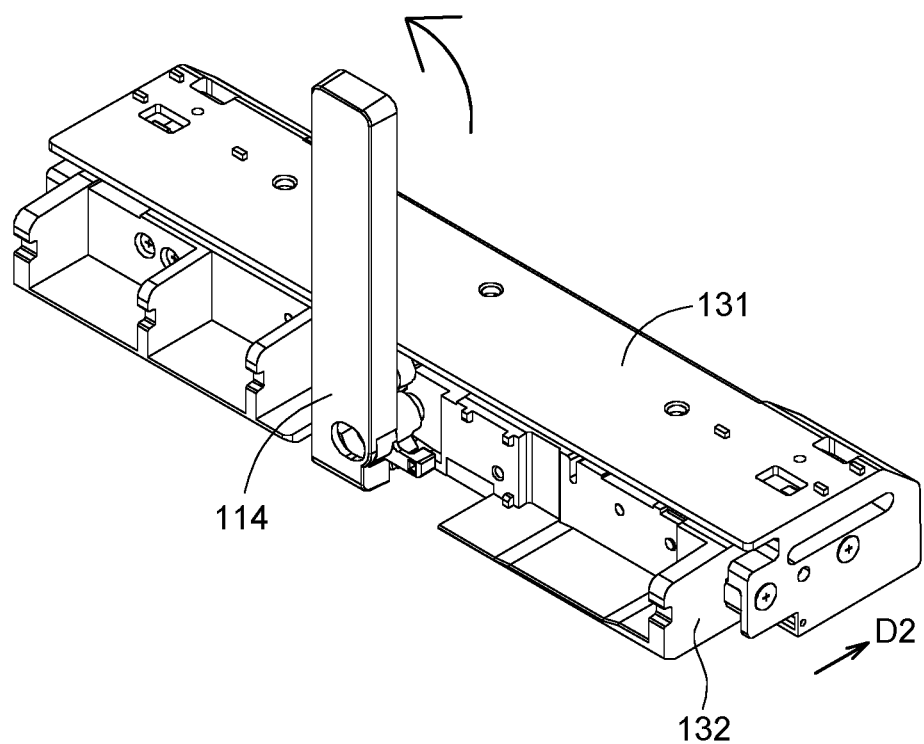

Refer to FIGS. 3A-3D. FIG. 3A is an explosion diagram of a color correction module 130 according to an embodiment of the present invention. FIGS. 3B-3D respectively are operation diagrams of the driving module 138 driving the correcting sensor 118 to translate to a first position from a receiving position, rotate to a second position from the first position and further move to a detecting position from the second position.

In an embodiment, the driving module 138 may include a transmission device 135, a first drive device 136, a second drive device 137 and a magnetic device 140. The carrier 132 is disposed on the transmission device 135, such that the carrier 132 can be movable. The transmission device 135, formed of gears 133, racks 134 and/or belts, is configured to drive the carrier 132. The two sides of the carrier 132 can have two gears 133 disposed thereon. The two gears 133 can be connected by a rod (not illustrated in the diagram), and are respectively engaged with the two racks 134 of the transmission device 135. The two racks 134 are disposed on a housing 131 configured to receive the carrier 132. The carrier 132 and the shaft 114 can be covered by a cover (not illustrated in the diagram), such that the carrier 132 and the shaft 114 will not be exposed. The first drive device 136, such as a motor and a gear set, is connected to the transmission device 135 and configured to drive the carrier 132 to move back and forth along a normal direction of the display surface 112 as indicated in FIG. 3C. The second drive device 137, such as a motor and a gear set, is connected to the shaft 114 and configured to drive the correcting sensor 118 to move the second position from the first position as indicated in FIG. 3D. Moreover, the magnetic device 140 can be an electromagnet, which selectively generates an attractive force or a repulsive force relative to the shaft 114, such that the shaft 114 can be moved between the second position and the detecting position.

In an embodiment, the magnetic device 140 includes a magnet 141 and an electromagnet 142. The electromagnet 142 can be disposed on the carrier 132. The magnet 141 can be disposed at the part of the shaft 114 closer to the axial end 115. The shaft 114 can selectively be translated relative to the rotation axis 116 along the direction D1 or the direction D2. The electromagnet 142 can be conducted to generate a magnetic force. When the shaft 114 is located at the second position, the magnet 141 and the electromagnet 142 generate an attractive force or a repulsive force relative to the shaft 114. Thus, the shaft 114 can be driven by the attractive force to translate to the detecting position along the direction D2 and get closer to the display surface 112. When the correcting sensor 118 is not needed, the electromagnet 142 can be conducted to generate a repulsive force relative to the magnet 141. Thus, the shaft 114 can be driven by the repulsive force to translate to the second position along the direction D1 and get away from the display surface 112.

Figure 4A:
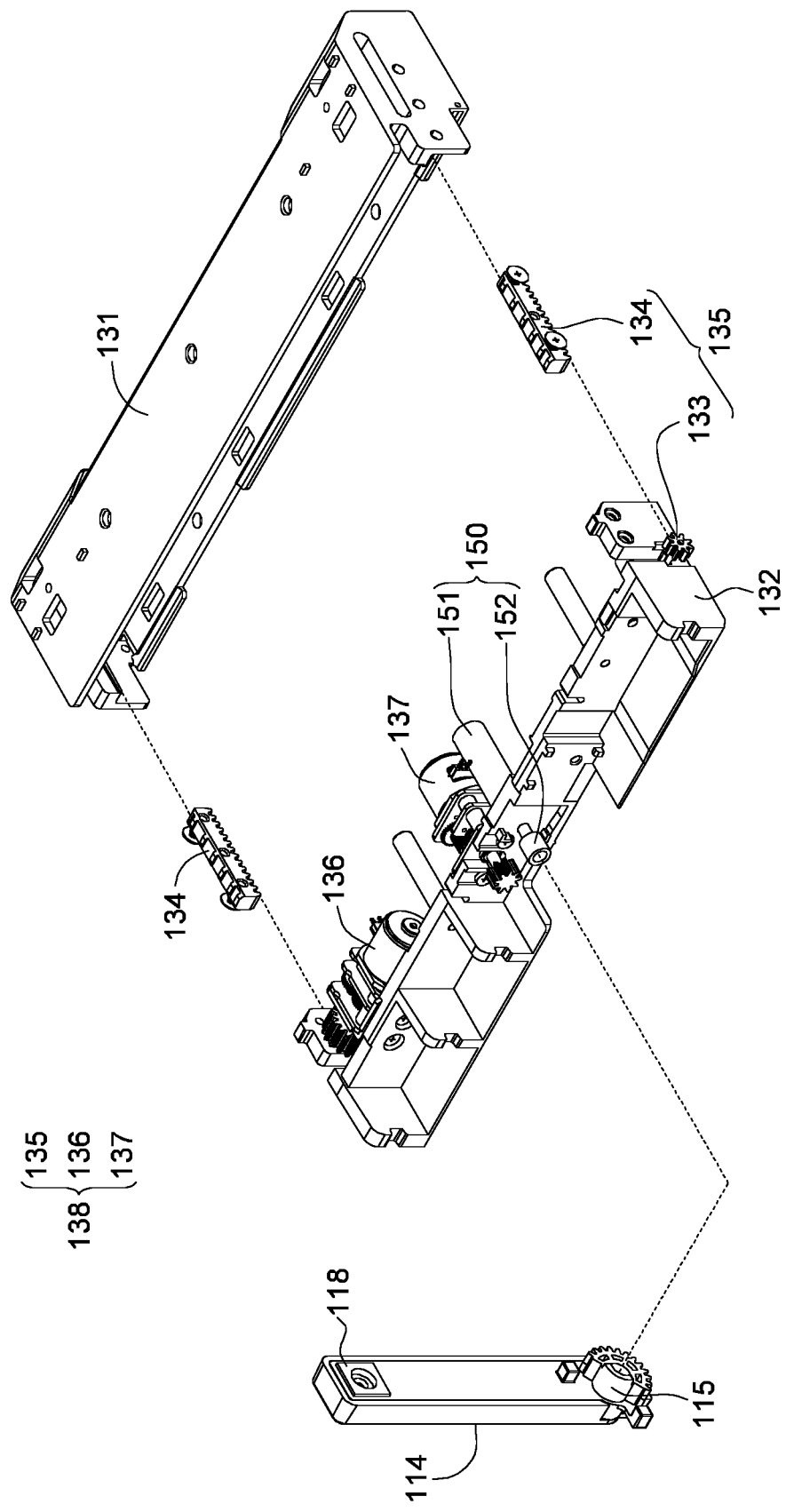
FIG. 4A is an explosion diagram of a color correction module according to another embodiment of the present invention.
Figure 4B:
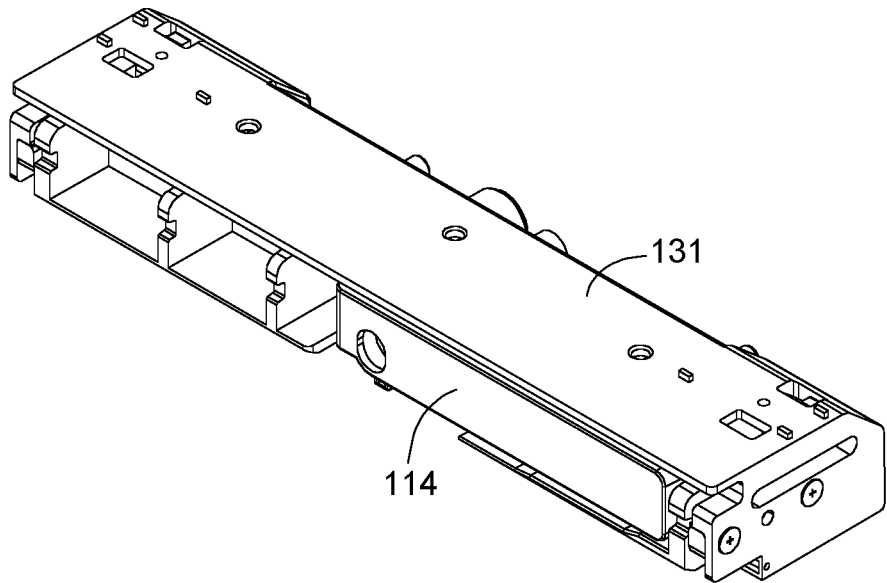
FIGS. 4B-4D respectively are operation diagrams of the driving module of FIG. 4A when driving a correcting sensor.
Figure 4C:
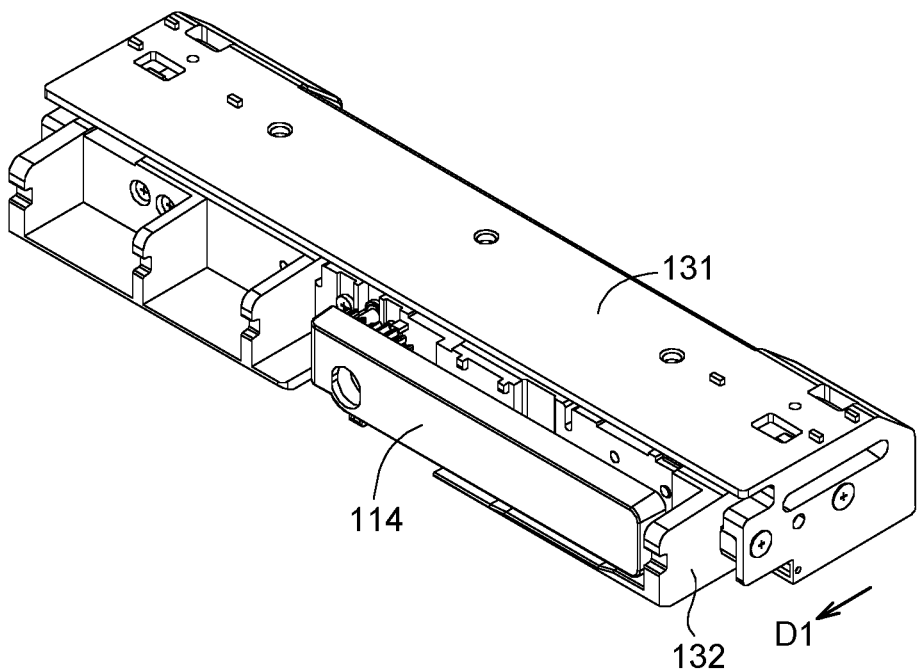
Figure 4D:
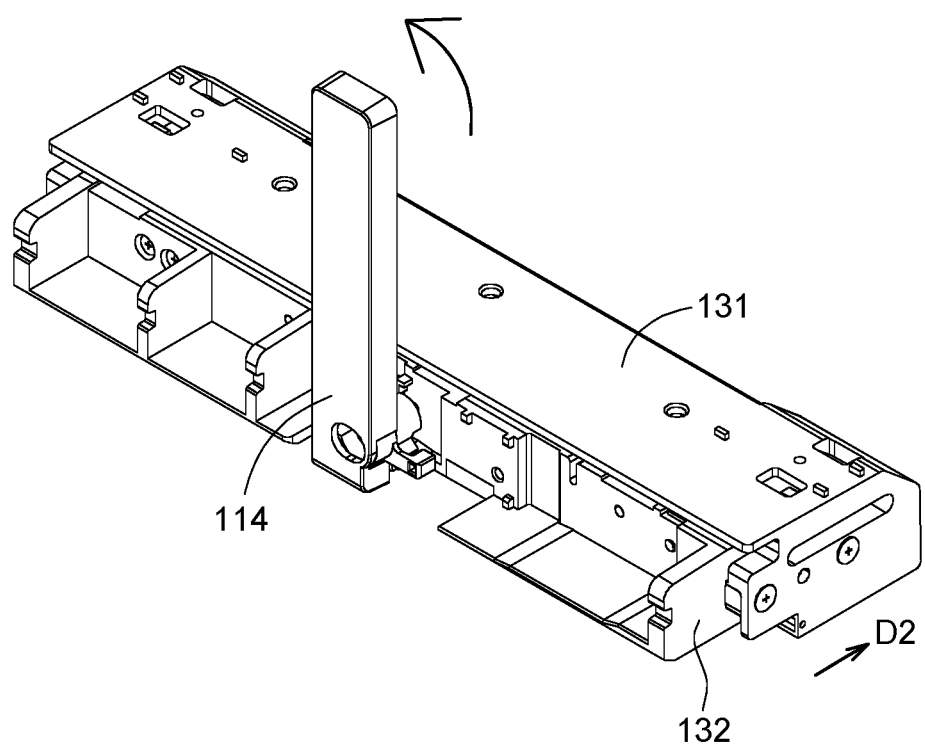

Refer to FIGS. 4A-4D. FIG. 4A is an explosion diagram of a color correction module 130 according to an embodiment of the present invention. FIGS. 4B-4D respectively are operation diagrams of the driving module 138 when driving the correcting sensor 118 to translate to a first position from a receiving position, rotate to a second position from the first position and further move to a detecting position from the second position.

The driving module 138 includes a transmission device 135, a first drive device 136 and a second drive device 137. The driving module 138 of the present embodiment is similar to the driving module 138 of the above embodiments except that the driving module 138 of the present embodiment may include a solenoid valve device 150, which generates a driving force to move the shaft 114 to the detecting position from the second position.

In an embodiment, the solenoid valve device 150 includes a valve 151 and an actuator 152. The actuator 152 is disposed at the axial end 115 of the shaft 114 and can be used as a rotation axis 116, which enables the shaft 114 to rotate relative to the actuator 152 and move to the second position from the first position as indicated in FIG. 4D. When the shaft 114 at the second position, the solenoid valve device is turned on, such that the actuator 152 can be translated. Thus, the shaft 114 can be driven by the actuator 152 to translate to the detecting position along the direction D2 and get closer to the display surface 112. When the correcting sensor 118 is not needed, the solenoid valve is turned off, such that the actuator 152 can be restored to the second position. Thus, the shaft 114 can be driven by the actuator 152 to translate to the second position along the direction D1 and get away from the display surface 112.

Figure 5A:
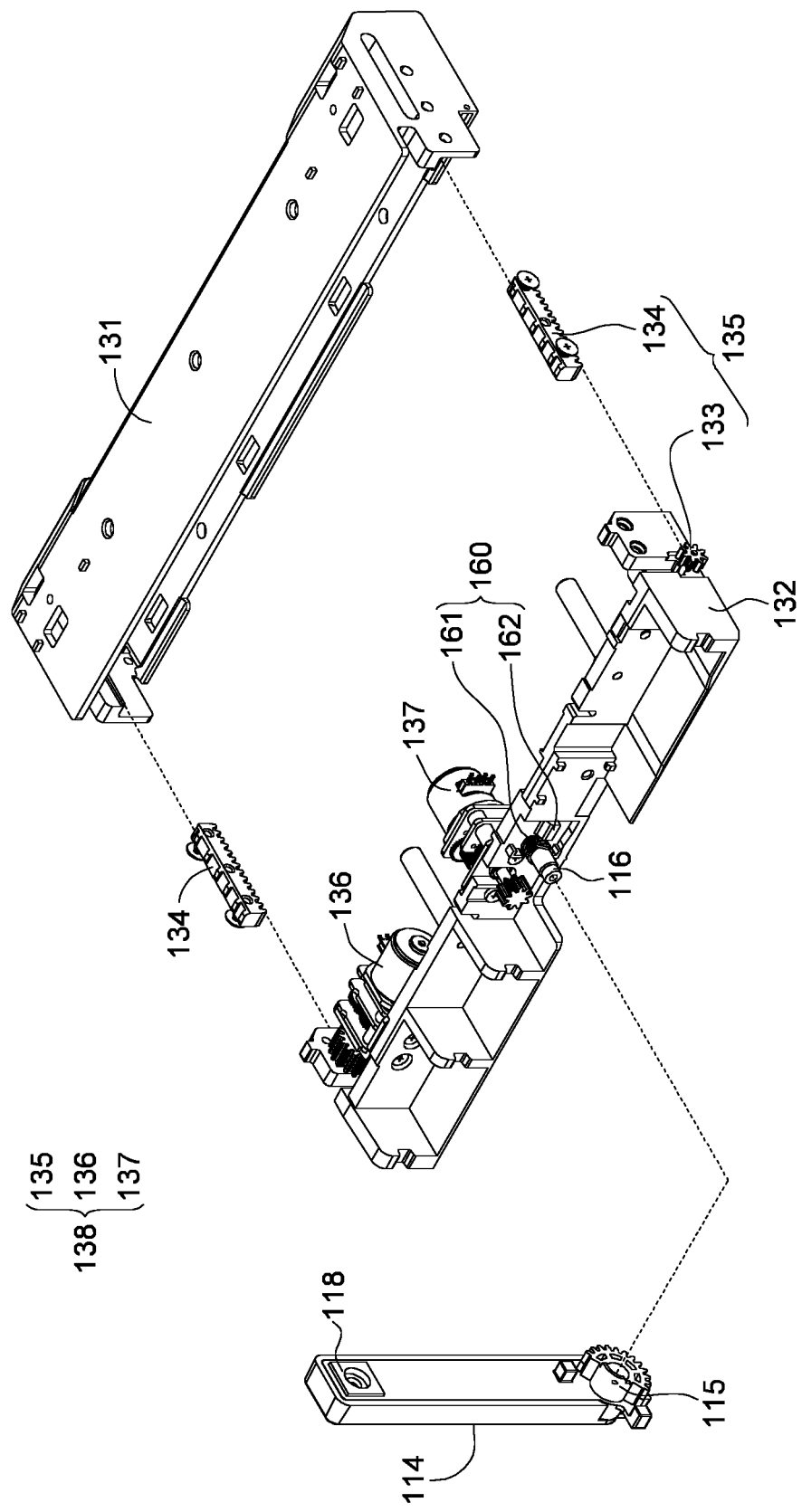
FIG. 5A is an explosion diagram of a color correction module according to another embodiment of the present invention.

Refer to FIGS. 5A-5D. FIG. 5A is an explosion diagram of a color correction module 130 according to an embodiment of the present invention.

Figure 5B:
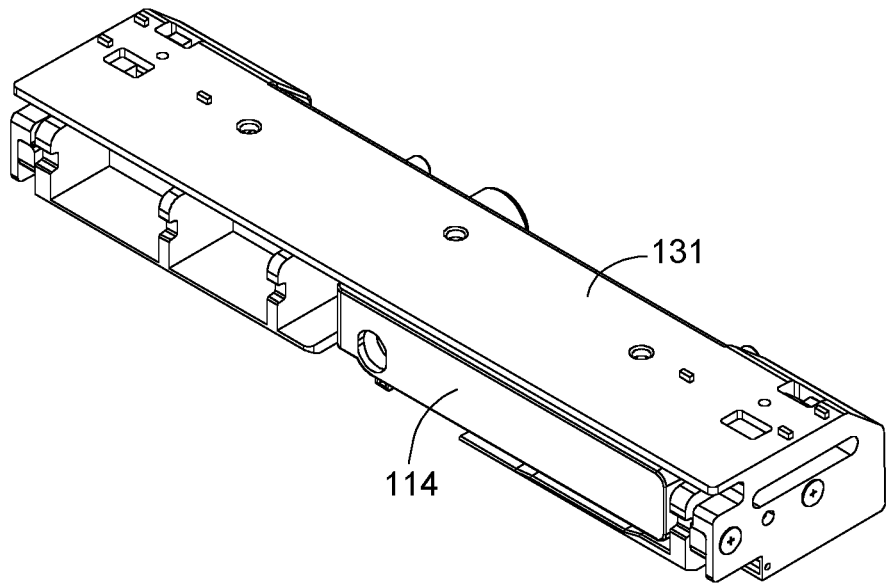
FIGS. 5B-5D respectively are operation diagrams of the driving module of FIG. 5A when driving a correcting sensor.
Figure 5C:
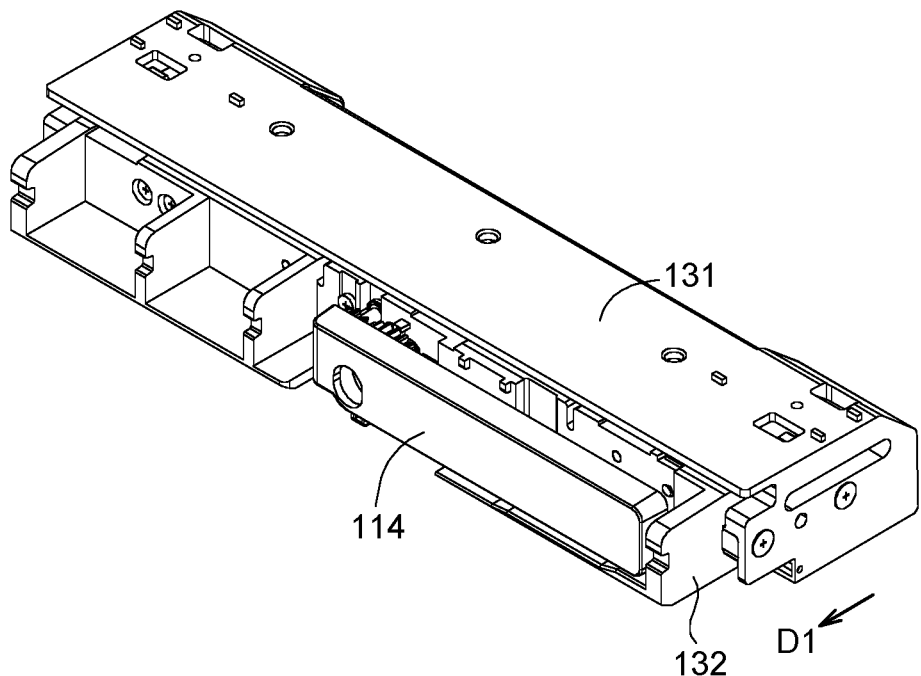
Figure 5D:
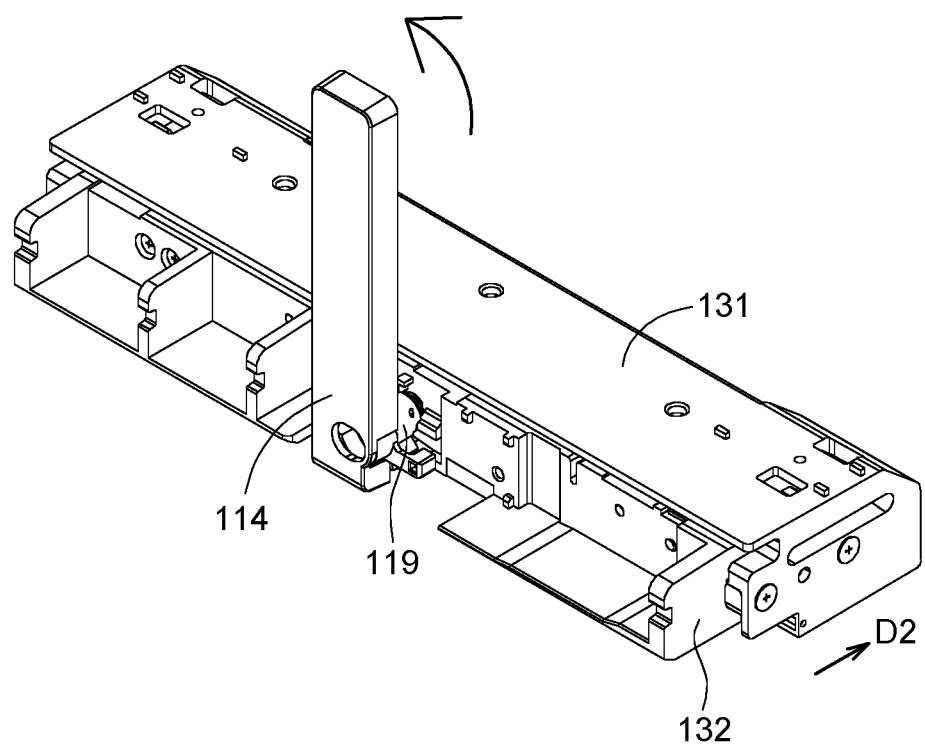

FIGS. 5B-5D respectively are operation diagrams of the driving module 138 when driving the correcting sensor 118 to translate to a first position from a receiving position, rotate to a second position from the first position and further move to a detecting position from the second position.

The driving module 138 includes a transmission device 135, a first drive device 136 and a second drive device 137. The driving module 138 of the present embodiment is similar to the driving module 138 of the above embodiments except that the driving module 138 of the present embodiment may include an elastic device 160, which generates a driving force to move the shaft 114 to the detecting position from the second position.

In an embodiment, the elastic device 160 includes a spring 161 and a stopper 162. The spring 161, such as a compressed spring, is mounted on the rotation axis 116 and is connected between the shaft 114 and the carrier 132 to generate a pre-stress to the shaft 114. The stopper 162 can be disposed on one side of the rotation axis 116. When the shaft 114 is rotated to the first position from the second position, the stopper 162 can apply a reaction force to the shaft 114. The reaction force makes the shaft 114 contact the stopper 162, such that the shaft 114 can be pushed by the stopper 162 to move along a normal direction of the display surface 112 and get away from the display surface 112.

Figure 6A:
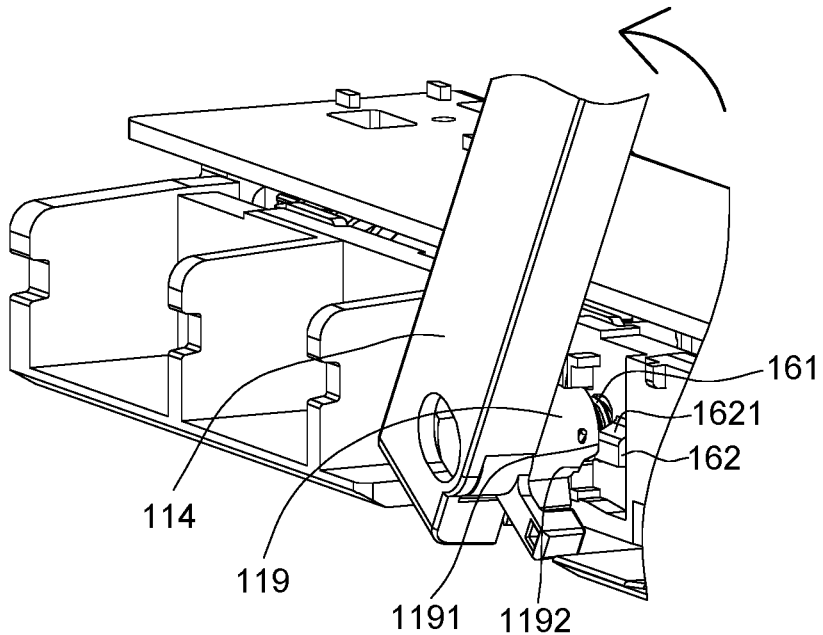
FIGS. 6A-6C respectively are operation diagrams of a shaft and a stopper of an elastic device.
Figure 6B:
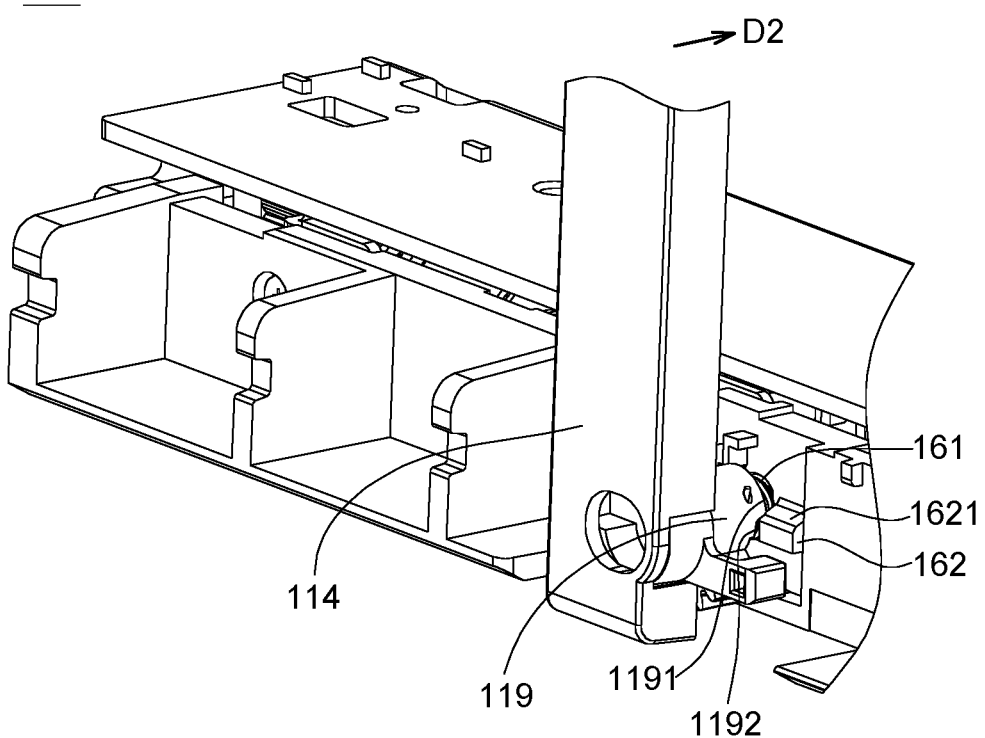
Figure 6C:
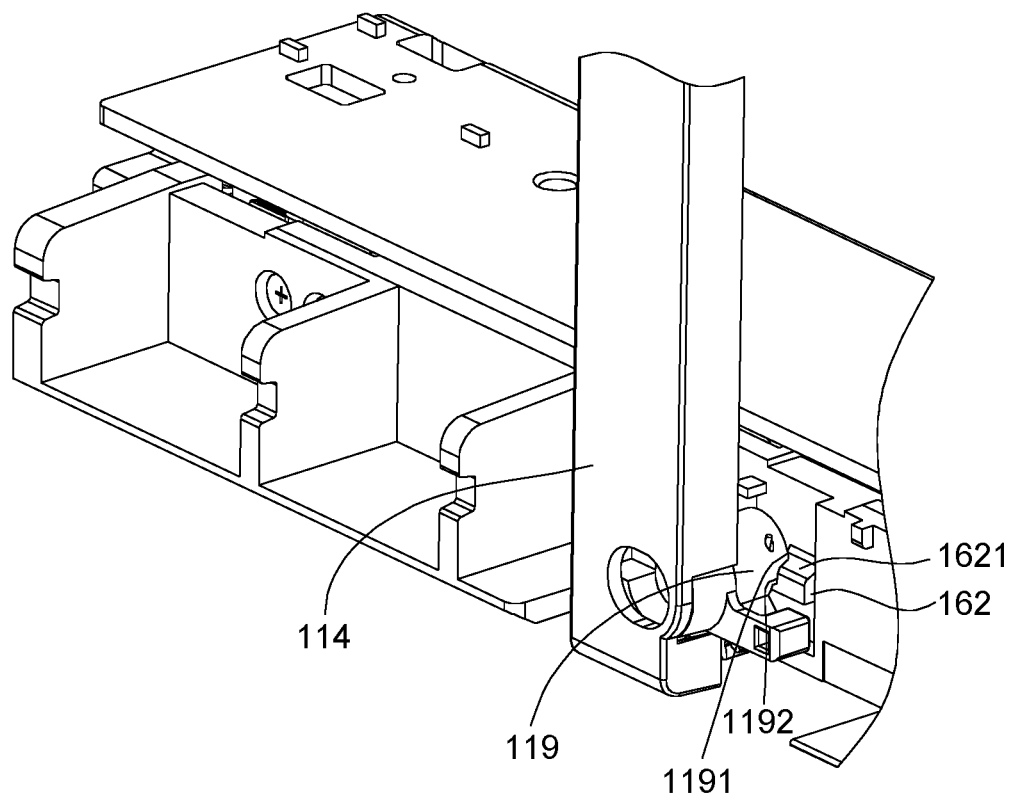

Referring to FIGS. 6A-6C, operation diagrams of a shaft 114 and a stopper 162 of an elastic device 160 are respectively shown. In the present embodiment, the bushing 119 of the shaft 114 may include a flange 1191 and a recess 1192, wherein the recess 1192 is located under the flange 1191 and has an arced surface, which matches the inclined surface 1621 of the stopper 162. As indicated in FIG. 6A, when the flange 1191 contacts the stopper 162, the shaft 114 is stopped by the stopper 162 and can no longer be moved towards the display surface 112. As indicated in FIG. 6B, when the flange 1191 is rotated to a yielding position and no longer contacts the stopper 162, the recess 1192 disposed under the flange 1191 provides a space, which allows the shaft 114 to move towards the second direction D2 such that the flange 1191 can move on the inclined surface 1621 of the stopper 162. As indicated in FIG. 6C, the shaft 114 is moved continuously until the recess 1192 contacts the inclined surface 1621 of the stopper 162. Conversely, for the shaft 114 to be restored to the state as in FIG. 6A, the shaft 114 is inversely rotated such that the flange 1191 can contact the stopper 162.

It can be understood from the above disclosure that the elastic device 160 can move the shaft 114 through the change in relative position between the flange 1191 and the stopper 162, such that the correcting sensor 118 can be moved to the detecting position.

Figure 7:
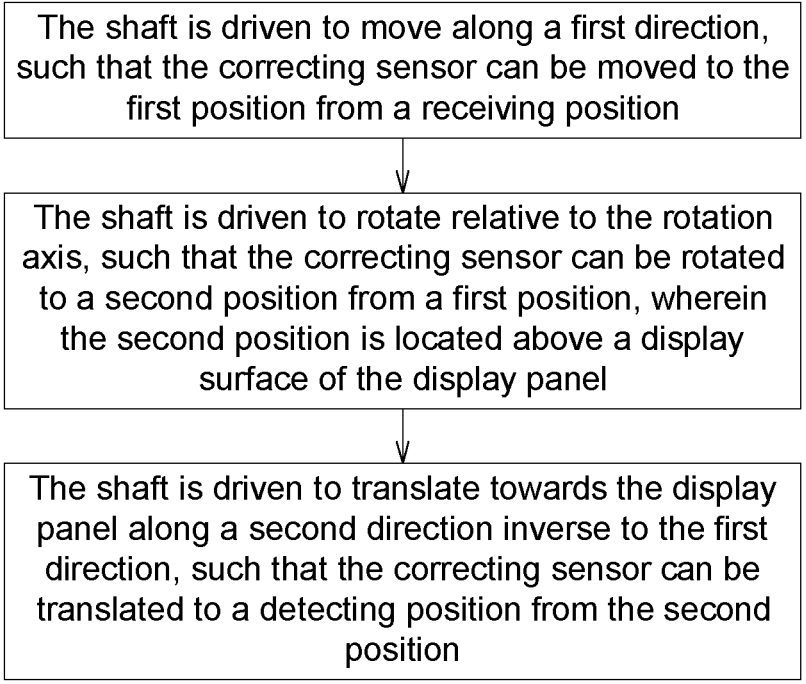
FIG. 7 is a schematic diagram of a color correcting method according to an embodiment of the present invention.

According to above embodiments, the present invention provides a color correcting method. Refer to FIGS. 1, 2A, 2B and the correction steps of FIG. 7. Firstly, the shaft 114 is moved along a first direction D1, such that the correcting sensor 118 can be moved to the first position from a receiving position. The shaft 114 is driven to rotate relative to the rotation axis 116, such that the correcting sensor 118 can be rotated to a second position from a first position, wherein the second position is located above a display surface of the display panel. The shaft 114 is driven to translate towards the display panel 110 along a second direction D2 inverse to the first direction D1, such that the correcting sensor 118 can be translated to a detecting position from the second position.

In an embodiment, the correcting sensor 118 is moved to the second position from the first position in a direction parallel to the display panel 110.

In an embodiment, the correcting sensor 118 is moved to the detecting position from the second position in a direction perpendicular to the display panel 110.

In an embodiment, after the correcting sensor 118 is driven to move to the first position from the receiving position along the first direction D1 for a first movement distance S1, the correcting sensor 118 is driven to rotate to the second position from the first position. Then, the correcting sensor 118 is driven to move to the detecting position from the second position along the second direction D2 to generate a second movement distance between S1 and S2, wherein the second movement distance between S1 and S2 is less than the first movement distance S1.

In an embodiment, the shaft 114 is driven to translate towards the display panel 110 along the second direction D2 by an attractive force or a repulsive force provided by a magnetic device 140 to generate a second movement distance between S1 and S2.

In an embodiment, the shaft 114 is driven to translate towards the display panel 110 along the second direction D2 by a solenoid valve device 150 to generate the second movement distance between S1 and S2.

In an embodiment, the shaft 114 is driven to translate towards the display panel 110 along the second direction D2 by an elastic device 160 to generate the second movement distance between S1 and S2.

In an embodiment, the shaft 114 is disposed on a carrier 132; when the correcting sensor 118 is located at the receiving position, an outer surface of the carrier 132 is coplanar with an outer surface of an outer casing 120 covering the edge of the display panel 110. The carrier 132 can be moved for the first movement distance S1 along the first direction D1 and can be moved for the second movement distance between S1 and S2 along the second direction D2.

Although the color correction module of the above embodiments is received in the outer casing of the display device, the present invention is not limited thereto. The color correction module can be plugged above the display surface of the display device or directly disposed above the display surface of the display device to correct the colors. Any design of the color correction module in which the correcting sensor is getting closer to the display surface when the correcting sensor is located at the second position above the display surface is within the scope of protection of the present invention.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
    a display panel having a display surface;
    a shaft having an axial end and a correcting end opposite the axial end;
    a correcting sensor disposed on the correcting end, wherein when the shaft is rotated relative to the axial end, the correcting sensor is moved to a second position from a first position and faces the display surface at the second position;
    a driving module configured to translate the shaft when the correcting sensor is at the second position, such that the correcting sensor can be moved to a detecting position from the second position, wherein a distance of the second position relative to the display surface is greater than a distance of the detecting position relative to the display surface, and
    a carrier on which the shaft is disposed, wherein when the correcting sensor is at the second position, the carrier is moved along a direction inverse to a normal direction of the display surface, such that the correcting sensor can be moved to the detecting position.

2. The display device according to claim 1, further comprising:
    an outer casing configured to receive the display panel and expose the display surface;
    wherein, the outer casing has an opening configured to receive the carrier, and the carrier moves back and forth along a normal direction of the display surface and has a front surface; when the carrier is received in the opening, the front surface of the carrier is coplanar with an outer surface of the outer casing, and the correcting sensor is located at a receiving position.

3. The display device according to claim 2, further comprising:
    a transmission device on which the carrier is disposed;
    a first drive device connected to the transmission device and configured to drive the carrier to move back and forth along the normal direction of the display surface, such that the correcting sensor is moved to the receiving position from the first position; and
    a second drive device connected to the shaft and configured to drive the correcting sensor to rotate to the second position from the first position.

4. The display device according to claim 1, wherein the driving module further comprises a magnetic device for generating an attractive force or a repulsive force relative to the shaft, such that the shaft moves between the second position and the detecting position based on the attractive force or the repulsive force.

5. The display device according to claim 1, wherein the driving module further comprises a solenoid valve device for driving the shaft to move between the second position and the detecting position.

6. The display device according to claim 1, wherein the driving module further comprises an elastic device for driving the shaft to move to the detecting position from the second position.

7. The display device according to claim 1, wherein the driving module drives the shaft to move to the detecting position from the second position in a direction perpendicular to the display surface.

8. A color correcting method for a display, wherein the display has a display panel and a shaft, a correcting sensor is disposed on a first end of the shaft and a second end of the shaft is connected to a rotation axis on an edge of the display panel, the method comprising:
    driving the shaft to move along a first direction with a carrier, such that the correcting sensor is moved to a first position from a receiving position;
    driving the shaft to rotate relative to the rotation axis, such that the correcting sensor is rotated to a second position from the first position, wherein the second position is located above a display surface of the display panel; and
    driving the shaft to translate towards the display panel along a second direction with the carrier, such that the correcting sensor is translated to a detecting position from the second position, wherein the second direction is inverse to the first direction.

9. The color correcting method according to claim 8, wherein the correcting sensor is moved to the second position from the first position in a direction parallel to the display panel.

10. The color correcting method according to claim 8, wherein the correcting sensor is moved to the detecting position from the second position in a direction perpendicular to the display panel.

11. The color correcting method according to claim 8, wherein the display comprises an outer casing covering the edge of the display panel, and the rotation axis is disposed on the outer casing.

12. The color correcting method according to claim 8, wherein the correcting sensor is driven to move to the first position from the receiving position along the first direction for a first movement distance, the correcting sensor is driven to move to the display panel along the second direction, such that the correcting sensor is moved to the detecting position from the second position to generate a second movement distance, wherein the second movement distance is less than the first movement distance.

13. The color correcting method according to claim 12, wherein the shaft is driven to translate towards the display panel along the second direction by an attractive force or a repulsive force provided by a magnetic device to generate the second movement distance.

14. The color correcting method according to claim 11, wherein the shaft is driven to translate towards the display panel along the second direction by a solenoid valve device to generate the second movement distance.

15. The color correcting method according to claim 11, wherein the shaft is driven to translate towards the display panel along the second direction by an elastic device to generate the second movement distance.

16. The color correcting method according to claim 11, wherein the shaft is disposed on a carrier, when the correcting sensor is located at the receiving position, an outer surface of the carrier is coplanar with an outer surface of an outer casing covering the edge of the display panel, the carrier is moved for the first movement distance along the first direction and moved for the second movement distance along the second direction.

17. A display device, comprising:
a display panel having a display surface;
an outer casing configured to receive the display panel and expose the display surface;
a shaft having an axial end and a correcting end opposite the axial end;
a correcting sensor disposed on the correcting end, wherein when the shaft is rotated relative to the axial end, the correcting sensor is moved to a second position from a first position and faces the display surface at the second position;
a driving module configured to translate the shaft when the correcting sensor is at the second position, such that the correcting sensor can be moved to a detecting position from the second position, wherein a distance of the second position relative to the display surface is greater than a distance of the detecting position relative to the display surface;
a carrier on which the shaft is disposed, wherein the outer casing has an opening configured to receive the carrier, and the correcting sensor is located at a receiving position;
a transmission device on which the carrier is disposed;
a first drive device connected to the transmission device and configured to drive the carrier to move back and forth along the normal direction of the display surface, such that the correcting sensor is moved to the receiving position from the first position; and
a second drive device connected to the shaft and configured to drive the correcting sensor to rotate to the second position from the first position.

* * * * *